(12) United States Patent
Bi et al.

(10) Patent No.: US 8,445,310 B2
(45) Date of Patent: May 21, 2013

(54) THIN FILM SOLAR CELL AND MANUFACTURING METHOD THEREOF

(75) Inventors: Chien-Chung Bi, Houli Township, Taichung County (TW); Chun-Hsiung Lu, Houli Township, Taichung County (TW)

(73) Assignee: Nexpower Technology Corp., Taichung County (TW)

( * ) Notice: Subject to any disclaimer, the term of this patent is extended or adjusted under 35 U.S.C. 154(b) by 163 days.

(21) Appl. No.: 12/704,880

(22) Filed: Feb. 12, 2010

(65) Prior Publication Data

US 2010/0210063 A1 Aug. 19, 2010

(30) Foreign Application Priority Data

Feb. 17, 2009 (TW) .............................. 98104897 A

(51) Int. Cl.
*H01L 21/00* (2006.01)

(52) U.S. Cl.
USPC .................. 438/72; 438/73; 438/485; 438/98; 257/80; 257/82; 257/461; 257/E31.037; 136/244; 136/246; 136/249; 136/251

(58) Field of Classification Search
USPC ................ 257/E31.037, E27.125, 80–82, 84, 257/461; 438/72–74, 57, 485, 96–98, 295, 438/298; 136/244, 246, 249, 251
See application file for complete search history.

(56) References Cited

U.S. PATENT DOCUMENTS

| | | | |
|---|---|---|---|
| 5,021,100 A | 6/1991 | Ishihara et al. | |
| 6,271,053 B1 | 8/2001 | Kondo | |
| 6,300,556 B1 | 10/2001 | Yamagishi et al. | |
| 6,452,089 B1 * | 9/2002 | Kubota | 136/251 |
| 6,632,993 B2 | 10/2003 | Hayashi et al. | |
| 6,870,088 B2 | 3/2005 | Tachibana et al. | |
| 2003/0172967 A1 * | 9/2003 | Tachibana et al. | 136/244 |

* cited by examiner

*Primary Examiner* — Evan Pert
*Assistant Examiner* — Mark A Laurenzi
(74) *Attorney, Agent, or Firm* — Ming Chow; Sinorica, LLC

(57) ABSTRACT

The present invention provides a stacked-layered thin film solar cell and manufacturing method thereof The manufacturing method includes the steps of: providing a substrate, a first electrode layer and a first light-absorbing layer; providing a mask with a plurality of patterns above the first light-absorbing layer; forming an interlayer made of an opaque, highly reflective material by providing the mask on the first light-absorbing layer, wherein the interlayer has a plurality of light transmissive regions corresponding to the patterns, and the light transmissive regions are provided to divide the interlayer into a plurality of units; and then depositing a second light-absorbing layer on the units and a second electrode layer on the second light-absorbing layer.

13 Claims, 5 Drawing Sheets

THIN FILM SOLAR CELL AND MANUFACTURING METHOD THEREOF

BACKGROUND OF THE INVENTION

1. Technical Field

The present invention relates to a stacked-layered thin film solar cell and a manufacturing method thereof. More particularly, the present invention relates to a manufacturing method which forms an interlayer and creates an isolation effect for a stacked-layered thin film solar cell by using a mask.

2. Description of Related Art

Generally speaking, a conventional stacked-layered thin film solar cell comprises a substrate, a first electrode layer, a light-absorbing layer and a second electrode layer in a series stacked structure. In a following packaging process, for eliminating problems about short-circuit faults and electric leakage, U.S. Pat. No. 6,300,556 proposes a method involving forming an isolation groove by scribing the solar cell near a periphery thereof for partially removing the first electrode layer, the semi-conductor layer and the second electrode layer, and the mechanically removing the first electrode layer, the semi-conductor layer and the second electrode layer or films of the three layers outside the isolation groove near a periphery of the substrate. In addition, the disclosure of U.S. Pat. No. 6,271,053 involves depositing the layers, dividing the deposited layers into serially connected solar cells, removing the second electrode layer and semi-conductor layer at peripheries of the cells so as to reveal the semi-conductor layer, and then thermally processing the revealed semi-conductor layer to oxidize its surface and thereby increase its resistance. Since the isolation grooves are formed by two types of laser beams of different wavelengths, the manufacturing procedures are complicated and therefore equipment costs as well as manufacturing cycle are enlarged. Furthermore, after the cutting process is performed, due to possible unevenness of the laser beams, part of the second electrode layer may be not fully removed and, in its melt state, remains on the first electrode layer, leading to short-circuit faults. Though using a single type of laser in length to process the three layers facilitates simplifying the manufacturing procedures, it is notable that the resultant thermal effect is greater and thus the induced short-circuit problem is more significant. Moreover, when thermal treatment is implemented at the late stage of the manufacturing procedures to oxidize the semi-conductor layer and thereby increase its resistance for averting the short-circuit problem, equipment costs and manufacturing cycle can be accordingly increased. Moreover, an interlayer is usually arranged between a material of a higher energy level and another material of a lower energy level so that when light passes through the stacked-layered thin film solar cell, a portion of the light having short wavelengths that can be absorbed by the material of the higher energy level is reflected to extend a light path while a portion of the light having long wavelengths that can not be absorbed by the material of the higher energy level is led to the material of the lower energy level so as to improve light transmission. For example, U.S. Pat. No. 5,021,100 proposes a dielectric selective reflection film in a stacked-layered thin film solar cell. Since the interlayer, for connecting materials of different energy levels, possesses electric conductivity, electric leakage and short-circuit faults can easily happen during an edge isolating process of the interlayer. Therefore, U.S. Pat. No. 6,632,993 further provides cutting grooves scribed on the interlayer for eliminating electric leakage when a current passes through the interlayer U.S. Pat. No. 6,870,088 also suggests a similar approach but further provides scribed grooves on a photoelectric conversion layer between cutting grooves so as to eliminate the above-mentioned problems. However, all of theses conventional approaches fail to address solutions to short-circuit faults at the edge of the battery. Therefore, a favorable solution to eliminate the above-mentioned problems is urgently in need.

BRIEF SUMMARY OF THE INVENTION

To overcome the shortcomings of the aforementioned prior art, the present invention provides a stacked-layered thin film solar cell and a manufacturing method thereof. The manufacturing method of the stacked-layered thin film solar cell includes providing a substrate and forming a first electrode layer on the substrate. Then the manufacturing method of the stacked-layered thin film solar cell forms a plurality of first grooves on the first electrode layer. Afterward, a first light-absorbing layer is formed on the first electrode layer and a mask with a plurality of patterns is provided above the first light-absorbing layer. Furthermore, an interlayer which is opaque and highly reflective is formed on the first light-absorbing layer by a mask in one step. The interlayer has a plurality of light transmissive regions corresponding to the patterns and the interlayer is divided into a plurality of units by the mask. Additionally, a second light-absorbing layer is formed on the interlayer and a plurality of second grooves is formed extending from the second light-absorbing layer through the first light-absorbing layer so as to divide the second light-absorbing layer and the first light-absorbing layer into a plurality of segments, wherein each the plurality of segments is corresponding to each the plurality of units. A second electrode layer is formed on the second light-absorbing layer and a plurality of third grooves is formed extending from the second electrode layer through the first light-absorbing layer. Besides, an offset is formed among the first grooves, the second grooves and the third grooves.

Accordingly, a primary objective of the present invention is to provide a manufacturing method of a stacked-layered thin film solar cell, wherein the mask with the plural patterns allows the formation of the interlayer and the isolating treatment thereof in one step, thereby reducing manufacturing costs.

A secondary objective of the present invention is to provide a manufacturing method of a stacked-layered thin film solar cell, wherein the mask with the plural patterns allows the interlayer to be divided into plural said segments in one step, thereby increasing light diffraction paths and improving light transmission efficiency.

Another objective of the present invention is to provide a manufacturing method of a stacked-layered thin film solar cell, wherein the division and layout of the interlayer can be adjusted by altering the patterns on the mask, thereby reducing manufacturing costs.

Besides, the present invention further provides a stacked-layered thin film solar cell that includes a substrate, a first electrode layer, a first light-absorbing layer, an interlayer, a second light-absorbing layer and a second electrode layer in a series stacked structure. A plurality of first grooves is formed on the first electrode layer. Then, a plurality of second grooves is formed extending from the second light-absorbing layer through the first light-absorbing layer. Afterward, a plurality of third grooves is formed extending from the second electrode layer through the first light-absorbing layer. An offset is formed among the first grooves, the second grooves and the third grooves. The interlayer is made with a plurality of units and a plurality of light transmissive regions spacing the units on the first light-absorbing layer by means of the mask. The interlayer is made of an opaque and highly reflective material. In virtue of the predetermined layout of the units and the light transmissive regions, an incident light is allowed to perform specific interference and diffraction of light that are composed of the light flux and light paths between the first light-absorbing layer and the second light-absorbing layer.

Therefore, another objective of the present invention is to provide a stacked-layered thin film solar cell, wherein the interlayer is opaque and highly reflective, thereby increasing the light transmission efficiency of the stacked-layered thin film solar cell.

Yet another objective of the present invention is to provide a stacked-layered thin film solar cell, wherein by altering the patterns of the mask, the layout of the light transmissive regions on the interlayer can be modified, thereby increasing light diffraction and improving the light transmission efficiency of the stacked-layered thin film solar cell.

BRIEF DESCRIPTION OF THE SEVERAL VIEWS OF THE DRAWINGS

The invention as well as a preferred mode of use, further objectives, and advantages thereof will be best understood by referring to the following description of illustrative embodiments in conjunction with the accompanying drawings, in which.

DETAILED DESCRIPTION OF THE INVENTION

The present invention provides a stacked-layered thin film solar cell and a manufacturing method thereof, wherein the principle of photoelectric conversion of solar cells is well known to a person of ordinary skill in the art and therefore will not be detailed herein. Besides, it is to be understood that the drawings referred to in the following description are intended to demonstrate features of the present invention only schematically, so the drawings are not need to be made in scale.

The present invention herein discloses a first preferred embodiment for a stacked-layered thin film solar cell manufacturing method with the particulars discussed below.

Figure 1:
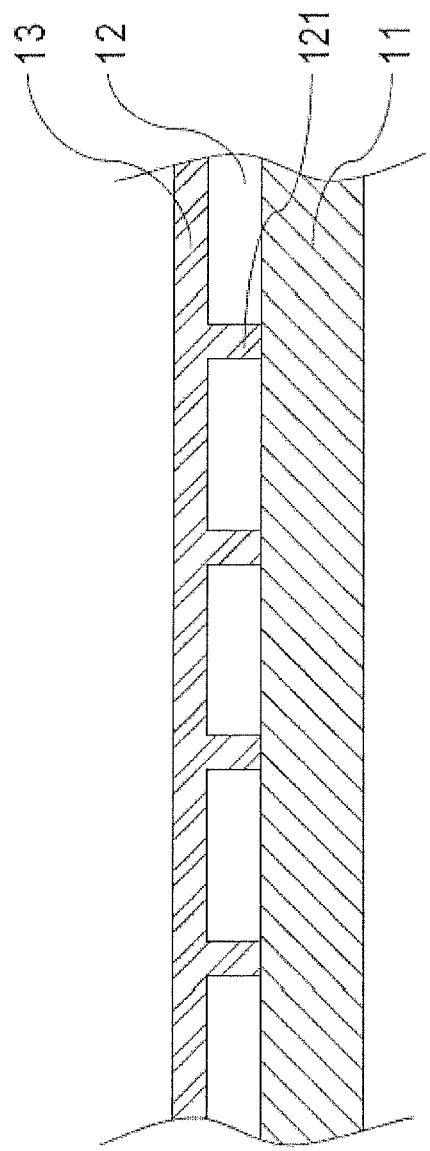
FIG. 1 is a schematic sectional drawings showing steps of a manufacturing method of a stacked-layered thin film solar cell according to a first preferred embodiment of the present invention.

Referring to FIG. 1, firstly, a substrate 11 that is transparent is provided and formed thereon with a first electrode layer 12 by means of sputtering deposition, atmospheric pressure chemical vapor deposition or low pressure chemical vapor deposition. The material from which the first electrode layer 12 is made can be tin dioxide, indium tin oxide, zinc oxide, aluminum zinc oxide, gallium zinc oxide or indium zinc oxide. The first electrode layer 12 can be structurally of a single-layer structure or a multi-layer structure. Afterward, a plurality of first grooves 121 is formed on the first electrode layer 12 before a first light-absorbing layer 13 is formed on the first electrode layer 12. The first light-absorbing layer 13 is preferably made by deposition. The material from which the first light-absorbing layer 13 is made can be monocrystalline silicon, polycrystalline silicon, amorphous silicon, microcrystalline silicon, germanium, germanium silicide or carbon silicide, which is not recited for purposes of limitation.

Since the interlayer, for connecting materials of different energy levels, possesses electric conductivity, electric leakage and short-circuit faults can easily happen during an edge isolating process of the interlayer. Although the known technology has used the etched isolating grooves to overcome this problem, such prior art approach is relatively complicated and time-consuming.

Figure 2:
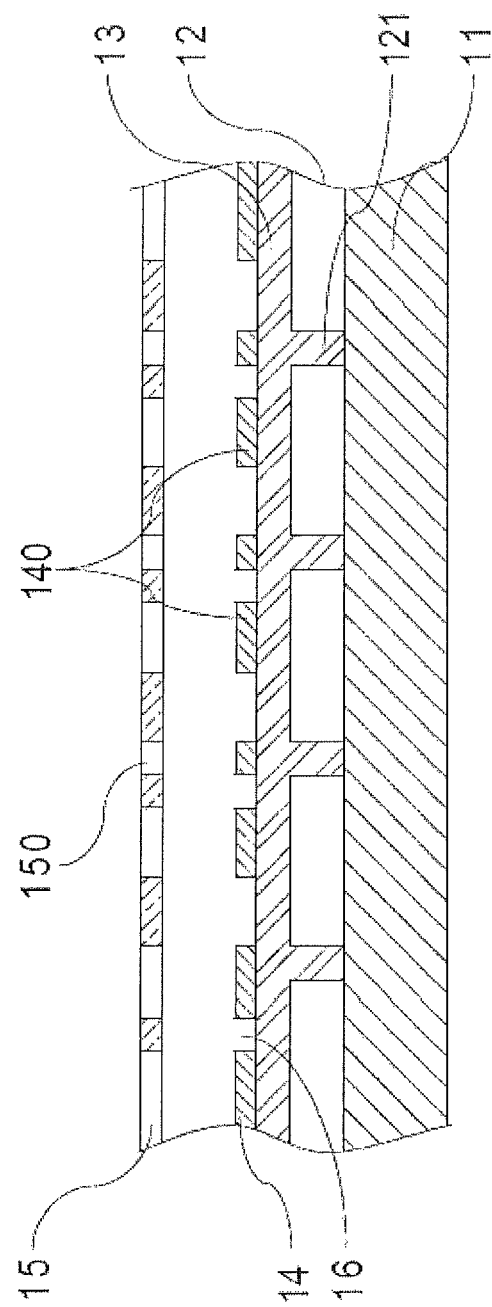
FIG. 2 is a schematic sectional drawings showing steps of a manufacturing method of a stacked-layered thin film solar cell according to a first preferred embodiment of the present invention.

Hence, referring to FIG. 2, the present invention herein proposes a novel solution where an interlayer 14 is formed in one step by means of a mask 15 and patterns 150 of the mask 15, while the isolating treatment is accomplished at the end of the formation of the interlayer 14. The detailed process for forming the interlayer 14 will be described herein with reference to FIG. 2. After the formation of the first light-absorbing layer 13, the mask 15 with plural patterns 150 is arranged above the first light-absorbing layer 13. Then, the interlayer 14 is formed on the first light-absorbing layer 13 in one step through the mask 15. As a result, the interlayer 14 is endowed with a plurality of light transmissive regions 16 that are corresponding to the aforesaid patterns 150 and the interlayer 14 is divided into a plurality of units 140. It is to be noted that the interlayer 14 must be made of an opaque and highly reflective material, such as gold, silver or aluminum, which, as compared with the transparent interlayer (e.g. transparent conductive oxide) used in the prior art, can significantly improve the reflectance. The interlayer 14 can be formed by means of physical vapor deposition or chemical vapor deposition.

In addition, according to the present invention, the patterns 150 of the mask 15 may be altered according to practical needs so as to adjust the number and layout of the units 140 and the light transmissive regions 16 on the interlayer 14, thereby simplifying the manufacturing process. While the widths of the units 140 and the light transmissive regions 16 are not to be limited, the width of the light transmissive regions 16 preferably ranges between 0.001 μm and 2000 μm. In view of this, the patterns 150 of the mask 15 is thus preferably designed for meeting the range of the width of the light transmissive regions 16, namely the patterns 150 with the width ranging between 0.001 μm and 2000 μm.

Figure 3:
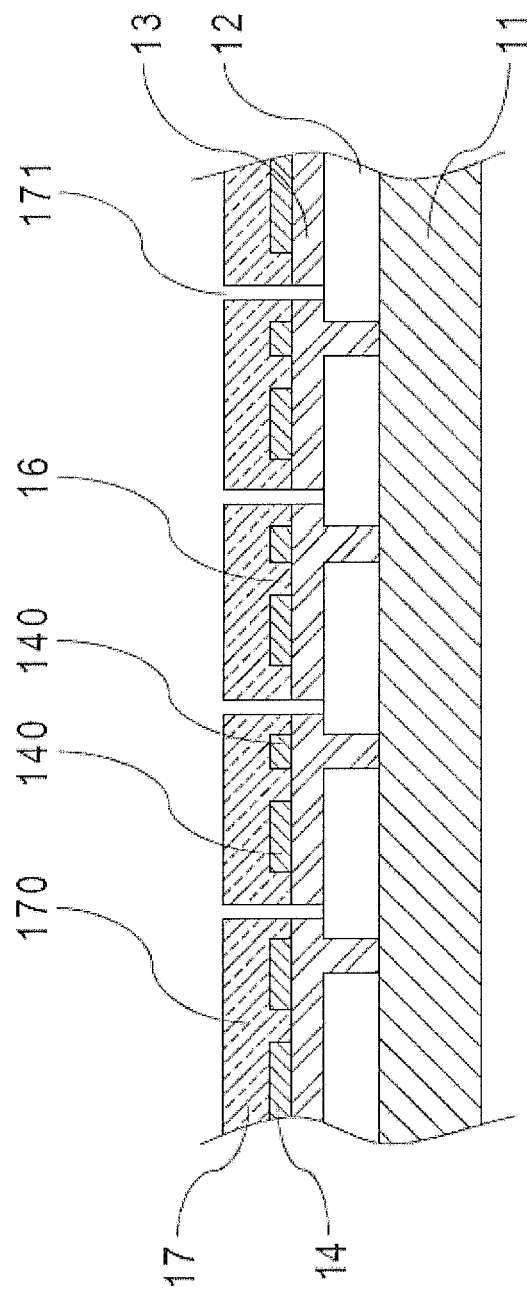
FIG. 3 is a schematic sectional drawings showing steps of a manufacturing method of a stacked-layered thin film solar cell according to a first preferred embodiment of the present invention.

Referring to FIG. 3, following the formation of the interlayer 14, a second light-absorbing layer 17 is further formed or deposited on the interlayer 14. The material from which the second light-absorbing layer 17 is made can be monocrystalline silicon, polycrystalline silicon, amorphous silicon, microcrystalline silicon, germanium, germanium silicide or carbon silicide. In addition, the second light-absorbing layer 17 further comprises a metal layer or a metal structure, made of silver, aluminum, chromium, titanium, nickel, lithium, or gold. Then, a plurality of second grooves 171 is formed and extended from the second light-absorbing layer 17 through the first light-absorbing layer 13, so as to divide the second light-absorbing layer 17 and the first light-absorbing layer 13 into a plurality of segments 170. Each the plurality of segments 170 is corresponding to each the plurality of units 140.

Figure 4:
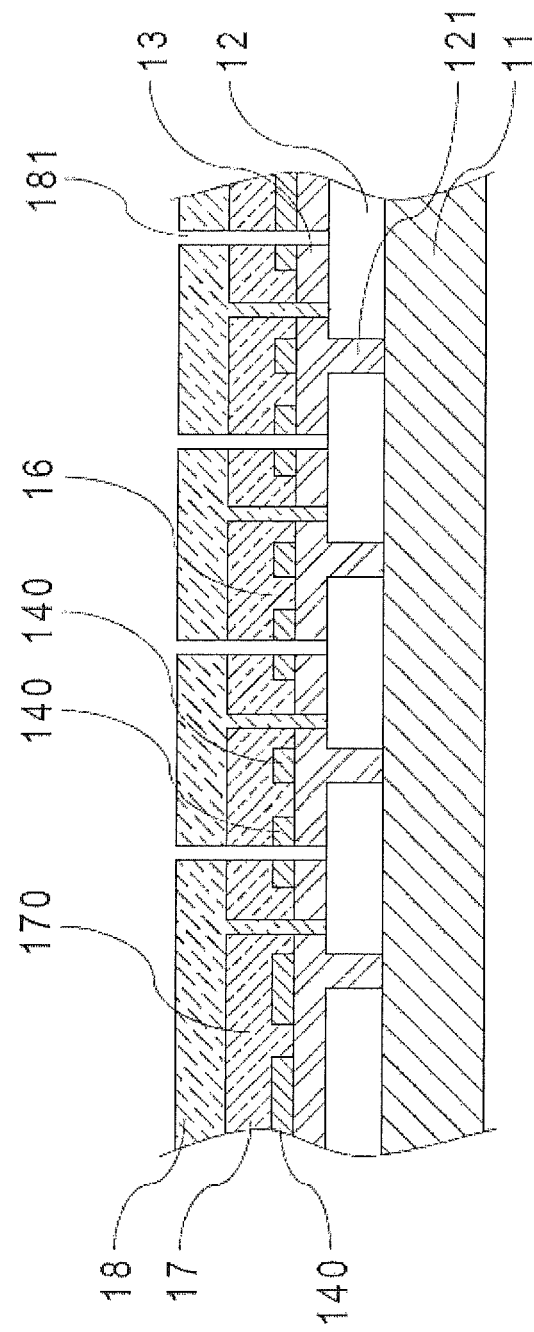
FIG. 4 is a schematic sectional drawings showing steps of a manufacturing method of a stacked-layered thin film solar cell according to a first preferred embodiment of the present invention.

Referring to FIG. 4, a second electrode layer 18 is formed on the second light-absorbing layer 17 by means of sputtering deposition or physical vapor deposition. The second electrode layer 18 can be structurally of a single-layer structure or a multi-layer structure. The second electrode layer 18 further comprises a transparent conductive oxide such as tin dioxide, indium tin oxide, zinc oxide, aluminum zinc oxide, gallium zinc oxide or indium zinc oxide. At last, a plurality of third grooves 181 is formed and extended from the second electrode layer 18 through the first light-absorbing layer 13. Therein, offsets are formed among the first grooves 121, the second grooves 171 and the third grooves 181.

Figure 5:
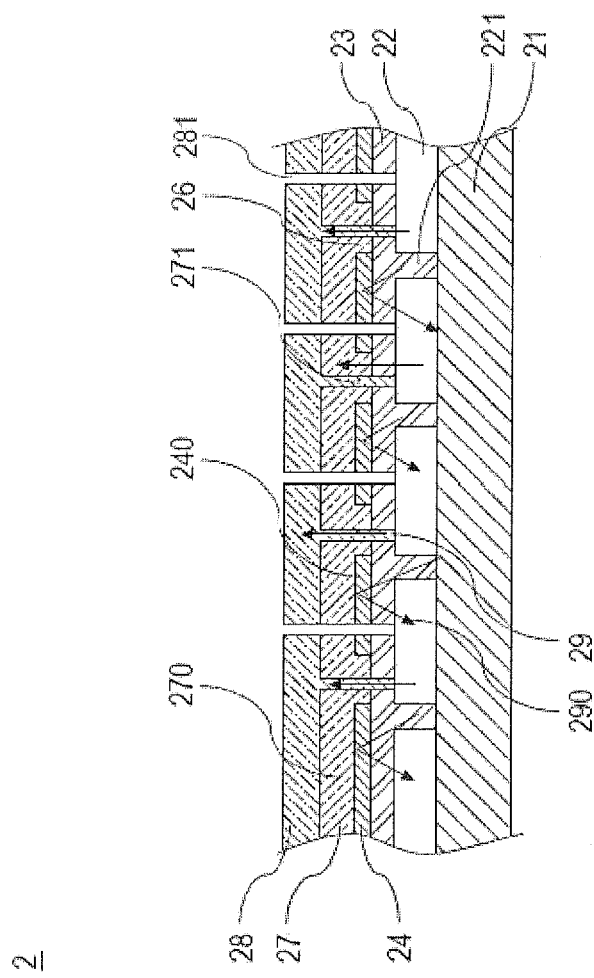
FIG. 5 is a schematic sectional drawing illustrating a stacked-layered thin film solar cell according to a second preferred embodiment of the present invention.

Referring to FIG. 5, the present invention further provides a second preferred embodiment, which is a stacked-layered thin film solar cell 2. The stacked-layered thin film solar cell 2 includes a substrate 21, a first electrode layer 22, a first light-absorbing layer 23, an interlayer 24, a second light-absorbing layer 27 and a second electrode layer 28 in a series stacked structure. On the first electrode layer 22, a plurality of first grooves 221 is formed. A plurality of second grooves 271 is formed and extended from the second light-absorbing layer 27 through the first light-absorbing layer 23 and a plurality of third grooves 281 is formed and extended from the second electrode layer 28 through the first light-absorbing layer 23. Also, offsets are formed among the first grooves 221, the second grooves 271 and the third grooves 281.

Referring to FIG. 2 and FIG. 5, the interlayer 24 is formed on the first light-absorbing layer 23 with the 1 units 240 and the light transmissive regions 26 spacing these units 240 by the mask 15. The material of the interlayer 24 shall at least be opaque and highly reflective. Thereby, in virtue of the predetermined layout of the units 240 and the light transmissive regions 26, an incident light 29 is allowed to perform specific interference and diffraction of light that are composed of the light flux and light paths from the first light-absorbing layer 23 through the second light-absorbing layer 27.

The stacked-layered thin film solar cell 2 of the present invention is structurally surpasses the prior art for the following advantage:

First, the interlayer 24 of the present invention is made of an opaque and highly reflective material, such as gold, silver or aluminum. It is clear that the reflectance of the prior art material is far lower than that of the present invention. The interlayer 24 of the present invention thus contributes to the light reflection paths 290 as shown in FIG. 5.

Second, the stacked-layered thin film solar cell 2 of the present invention is allowed to increase the amount of the units 240 on the interlayer 24 by altering the patterns on the mask 25 so as to provide the long- and short-wavelength portions of light passing through the light transmissive regions 26 with increased diffraction paths due to the increased light transmissive regions 26, thereby being more beneficial in enhancing light transmission.

Third, the light transmissive regions 26 of the present invention, in addition to isolating, serves to divide the interlayer 24 into more units 240 in one step and provide more light paths to the long-wavelength portion of the light that is non-absorbable to the first light-absorbing layer 23 and the short-wavelength portion of the light that is not fully absorbed by the first light-absorbing layer 23, thereby significantly increasing the light paths and improving light transmission, thus being superior to the prior art.

The present invention is described herein by reference to the preferred embodiments, and it is understood that the embodiments are not intended to limit the scope of the present invention. Moreover, as the contents disclosed herein should be readily understood and can be implemented by a person skilled in the art, all equivalent changes or modifications which do not depart from the spirit of the present invention should be encompassed by the appended claims.

What is claimed is:

1. A manufacturing method of a stacked-layered thin film solar cell, comprising the steps of:
   providing a substrate;
   forming a first electrode layer on the substrate;
   forming a plurality of first grooves on the first electrode layer;
   forming a first light-absorbing layer on the first electrode layer;
   providing a mask with a plurality of patterns above the first light-absorbing layer;
   forming an interlayer is made of an opaque and highly reflective on the first light-absorbing layer by the mask, wherein the interlayer further comprises a plurality of light transmissive regions that are corresponding to the patterns, where by the interlayer is divided into a plurality of units, whereby the amount of the units on the interlayer is increased to provide the long- and short-wavelength portions of light passing through the light transmissive region with increased diffraction paths due to the increase the light transmissive region;
   forming a second light-absorbing layer on the interlayer;
   forming a plurality of second grooves extending from the second light-absorbing layer through the first light-absorbing layer, so as to divide the second light-absorbing layer and the first light-absorbing layer into a plurality of segments, wherein each said plurality of segment is corresponding to at least two units of the interlayer;
   forming a second electrode layer on the second light-absorbing layer; and
   forming a plurality of third grooves extending from the second electrode layer through the first light-absorbing layer, wherein an offset is formed among the first grooves, the second grooves and the third grooves;
   whereby, an incident light is allowed to perform specific interference and diffraction of light that are composed of the light flux and a light paths from the first light-absorbing layer through the second light-absorbing layer.

2. The manufacturing method of claim 1, wherein the light transmissive region has a width ranging between 0.001 un and 2000 um.

3. The manufacturing method of claim 1, wherein the interlayer is formed on the first light-absorbing layer by a method selected from the group consisting of physical vapor deposition and chemical vapor deposition.

4. The manufacturing method of claim 1, wherein the interlayer is made of a material selected from the group consisting of gold, silver, and aluminum.

5. The manufacturing method of claim 1, wherein the first electrode layer is made of a material selected from the group consisting of tin dioxide, indium tin oxide, zinc oxide, aluminum zinc oxide, gallium zinc oxide and indium zinc oxide.

6. The manufacturing method of claim 1, wherein the second electrode layer further comprises a metal layer, which is made of a material selected from the group consisting of silver, aluminum, chromium, titanium, nickel and gold.

7. The manufacturing method of claim 1, wherein the second electrode layer further comprises a transparent conductive oxide, which is made of a material selected from the group consisting of tin dioxide, indium tin oxide, zinc oxide, aluminum zinc oxide, gallium zinc oxide and indium zinc oxide.

8. The manufacturing method of claim 1, wherein the first electrode layer is formed on the substrate by a method selected from the group consisting of sputtering deposition, atmospheric pressure chemical vapor deposition and low pressure chemical vapor deposition.

9. The manufacturing method of claim 1, wherein the first light-absorbing layer is formed on the first electrode layer by means of deposition.

10. The manufacturing method of claim 1, wherein the first light-absorbing layer is made of a material selected from the group consisting of monocrystalline silicon, polycrystalline silicon, amorphous silicon, microcrystalline silicon, germanium, germanium silicide and carbon silicide.

11. The manufacturing method of claim 1, wherein the second light-absorbing layer is made of a material selected from the group consisting of monocrystalline silicon, polycrystalline silicon, amorphous silicon, microcrystalline silicon, germanium, germanium silicide and carbon silicide.

12. The manufacturing method of claim 1, wherein the second light-absorbing layer is formed on the first electrode layer by means of deposition.

13. The manufacturing method of claim 1, wherein the second electrode layer is formed on the second light-absorbing layer by a method selected from the group consisting of sputtering deposition and physical vapor deposition.

* * * * *